United States Patent
Tanji

(10) Patent No.: US 10,637,426 B2
(45) Date of Patent: Apr. 28, 2020

(54) AUDIO DEVICE AND CONTROL METHOD FOR AN AUDIO DEVICE

(71) Applicant: YAMAHA CORPORATION, Hamamatsu-shi (JP)

(72) Inventor: Ryoji Tanji, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 16/105,047

(22) Filed: Aug. 20, 2018

(65) Prior Publication Data

US 2018/0358946 A1 Dec. 13, 2018

Related U.S. Application Data

(63) Continuation of application No. PCT/JP2017/007983, filed on Feb. 28, 2017.

(30) Foreign Application Priority Data

Mar. 1, 2016 (JP) .................................. 2016-038596

(51) Int. Cl.
*H04R 29/00* (2006.01)
*H03G 7/06* (2006.01)
(Continued)

(52) U.S. Cl.
CPC .............. *H03G 7/06* (2013.01); *G06F 3/165* (2013.01); *H03F 3/183* (2013.01); *H03F 3/21* (2013.01);
(Continued)

(58) Field of Classification Search
CPC . H03G 7/06; H03G 3/348; H03G 3/04; H04R 5/04; H04R 3/00; H03F 3/21; H03F 3/183; G06F 3/165
(Continued)

(56) References Cited

U.S. PATENT DOCUMENTS

| 8,180,072 B2 | 5/2012 | Sakai | |
|---|---|---|---|
| 2009/0067645 A1* | 3/2009 | Sakai | ................... H03G 1/0094 381/107 |
| 2013/0148825 A1* | 6/2013 | Fukuma | ................... H03G 3/20 381/107 |

FOREIGN PATENT DOCUMENTS

| CN | 1742514 A | 3/2006 |
|---|---|---|
| CN | 104168524 A | 11/2014 |

(Continued)

OTHER PUBLICATIONS

International Search Report issued in Intl. Appln. No. PCT/JP2017/007983 dated May 23, 2017. English translation provided.
Written Opinion issued in Intl. Appln. No. PCT/JP2017/007983 dated May 23, 2017.
"Power Amplifier TX6n/TX5n/TX4n, Owner's Manual" 2009-2011: 1-21. Yamaha Corporation. Japan. Cited in Specification. English translation provided.

(Continued)

*Primary Examiner* — Ammar T Hamid
(74) *Attorney, Agent, or Firm* — Rossi, Kimms & McDowell LLP

(57) ABSTRACT

An audio device includes: a processor configured to perform signal processing on the sound signal according to a value of a parameter; a display; a plurality of operating elements; a controller configured to: change the value of the parameter in accordance with an operation performed through any one of the plurality of operating elements; cause the display to display the value of the parameter; and write the value of the parameter in the current memory; and a detector. The controller is configured to: execute a first routine, which is uninterruptable by another routine, when the detector detects the malfunction; and cause, in the first routine, the display to display a first message without newly storing the value of the parameter; and mute, in the first routine, the processed signal in accordance with an operation performed through any one of the plurality of operating elements.

10 Claims, 5 Drawing Sheets

(51) Int. Cl.
*H03G 3/34* (2006.01)
*H03G 3/04* (2006.01)
*H04R 5/04* (2006.01)
*H04R 3/00* (2006.01)
*G06F 3/16* (2006.01)
*H03F 3/183* (2006.01)
*H03F 3/21* (2006.01)
*H03G 3/00* (2006.01)

(52) U.S. Cl.
CPC ............... *H03G 3/04* (2013.01); *H03G 3/348* (2013.01); *H04R 3/00* (2013.01); *H04R 5/04* (2013.01); *H04R 29/00* (2013.01); *H03F 2200/03* (2013.01); *H04R 29/001* (2013.01); *H04R 2430/01* (2013.01)

(58) Field of Classification Search
USPC ................ 381/56–58, 120, 102–109; 330/75
See application file for complete search history.

(56) References Cited

FOREIGN PATENT DOCUMENTS

| | | |
|---|---|---|
| JP | 2003091287 A | 3/2003 |
| JP | 2003209449 A | 7/2003 |
| JP | 2009065427 A | 3/2009 |
| JP | 2009065550 A | 3/2009 |
| JP | 2009159537 A | 7/2009 |
| JP | 2012004981 A | 1/2012 |
| JP | 2012039430 A | 2/2012 |
| JP | 2012085040 A | 4/2012 |

OTHER PUBLICATIONS

Office Action issued in Japanese Appln. No. 2016-038596 dated Oct. 8, 2019. English machine translation provided.

Office Action issued in Chinese Appln. No. 201780012768.2 dated Dec. 31, 2019. English translation provided.

\* cited by examiner

AUDIO DEVICE AND CONTROL METHOD FOR AN AUDIO DEVICE

CROSS-REFERENCE TO RELATED APPLICATION

The present application is continuation of International Application No. PCT/JP 2017/007983 filed on Feb. 28, 2017, which claims priority from Japanese Application No. JP 2016-038596 filed on Mar. 1, 2016. The contents of these applications are hereby incorporated by reference into this application.

BACKGROUND OF THE INVENTION

1. Field of the Invention

The present invention relates to: an audio device including a processor configured to perform signal processing on a sound signal and a controller configured to control the processor; and a control method for an audio device.

2. Description of the Related Art

A power amplifier, which is an example of related-art audio devices, has a direct control type, in which an analog sound signal passes through a manual variable resistor of a knob for adjusting a level, and an indirect control type (see Japanese Patent Application Laid-open No. 2009-159537 and Yamaha Corporation, POWER AMPLIFIER TX6n/TX5n/TX4n, Instruction Manual [online], [retrieved on Jan. 18, 2016], the Internet <http://download.yamaha.com/api/asset/file?language=ja&site=countrysite-master.prod.wsys.yamaha.com&asset_id=47875>). In the indirect control type, a central processing unit (CPU) functioning as a controller controls a processor configured to perform signal processing on a sound signal, to thereby control the level of the sound signal.

SUMMARY OF THE INVENTION

In the power amplifier of the related-art direct control type, when a user finds some malfunction in the amplifier, the user can immediately mute the sound signal by turning a level knob counterclockwise. However, there is a fear that, due to the aging of a brush of the manual variable resistor, the sound signal output by the amplifier may deteriorate.

In addition, in the related-art indirect control type, when a malfunction occurs in the CPU for performing control, in order to prevent unpleasant sound from being emitted from a loudspeaker or prevent an audio device in a subsequent stage from being broken, the CPU immediately performs control so as to mute the sound signal being output by the processor. The sound signal is muted, and thus the user can turn off the power of the power amplifier safely.

However, even when a malfunction occurs in the CPU, there may be no problem with the sound being output from the loudspeaker or the like by the power amplifier at that time point. Therefore, there has been a problem that the CPU may mute the sound being emitted when a malfunction occurs in the CPU of the amplifier even when there is no problem with the sound output being from the loudspeaker or the like.

Therefore, this disclosure has an object to continue, when a malfunction is detected in a controller of an audio device, signal processing performed by a processor at that time point, and notify a user that the malfunction has occurred to allow the user to select the muting of sound being output.

In order to achieve the above-mentioned object, according to one embodiment of this disclosure, there is provided an audio device including: a processor configured to receive a sound signal and perform signal processing on the sound signal to output the processed signal; a display; a plurality of operating elements; a controller configured to: change a value of a parameter based on an operation performed through any one of the plurality of operating elements by a user; cause the display to display the value of the parameter; and write the value of the parameter in a current memory; and a detector configured to detect that a malfunction has occurred in an operation of the controller, wherein the processor is configured to perform signal processing according to the value of the parameter stored in the current memory, wherein the controller is configured to: execute a first routine, which involves avoiding receiving an interrupt from another routine, when the detector detects the malfunction; and cause, in the first routine, the display to display a first message without newly storing the value of the parameter in the current memory; and mute, in the first routine, the processed signal based on an operation performed through any one of the plurality of operating elements.

This disclosure can not only be carried out as a device as described above, but can also be carried out as a system, a method, a program, a recording medium having a program stored thereon, and any other form.

DETAILED DESCRIPTION OF THE INVENTION

Now, an audio device according to an embodiment of this disclosure is specifically described with reference to the accompanying drawings.

Figure 1:
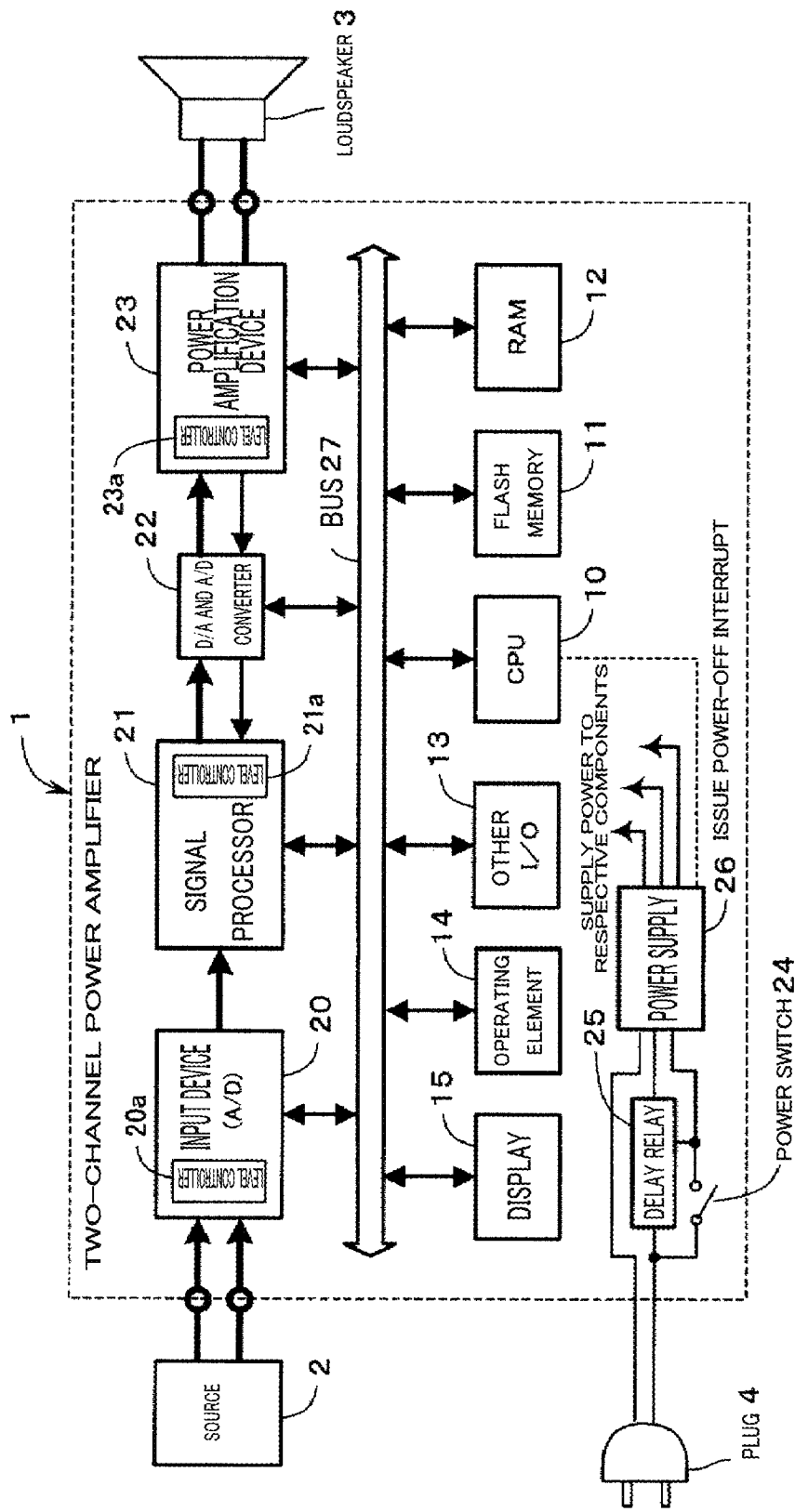
FIG. 1 is a functional block diagram for illustrating a configuration of a two-channel power amplifier being an audio device according to an embodiment of this disclosure.

First, FIG. 1 is a functional block diagram for illustrating a configuration of a two-channel power amplifier (hereinafter referred to as "amplifier") 1 being the audio device according to the embodiment of this disclosure.

The amplifier 1 illustrated in FIG. 1 includes two channels of an A-channel and a B-channel, and also includes a central processing unit (CPU) 10, a flash memory 11, a random access memory (RAM) 12, another input-output (I/O) 13, an operating element 14, a display 15, an input device 20, a signal processor 21, a D/A and A/D converter 22, and a power amplification device 23. Those components are connected to one another by a bus 27. The amplifier 1 further includes a power supply 26 configured to supply power to each of the components, a power switch 24, and a delay relay 25. The above-mentioned signal processor 21 may be formed of a digital signal processor (DSP).

Of those, the CPU 10 is a controller configured to centrally control an operation of the amplifier 1. The CPU 10 executes a control program stored in the flash memory 11, to thereby perform processing for editing a parameter based on an operation performed through the operating element 14, controlling display performed on the display 15, and controlling signal processing performed by the signal processor 21. The flash memory 11 is a rewritable nonvolatile storage for storing, for example, the control program to be executed by the CPU 10 and presets. The RAM 12 is a volatile storage that allows the CPU 10 to write and read various kinds of data, and is also used as a work memory for the CPU 10 and a current memory configured to store current data being the parameter of the amplifier 1. The other I/O 13 is an interface for communication through connection to different kinds of external devices. An Ethernet (trademark), a universal serial bus (USB), or any other standard can be employed to be used for the communication performed through the other I/O 13 irrespective of whether the communication is performed in a wired manner or a wireless manner. The display 15 is a display for displaying various kinds of information under the control of the CPU 10, and can be formed of, for example, a liquid crystal panel (LCD) or a light emitting diode (LED).

In the amplifier 1, the signal processor 21 performs the signal processing on the two channels of the A-channel and the B-channel. The input device 20 receives analog sound signals for the A-channel and the B-channel from an external source 2, converts the respective analog sound signals into digital sound signals, and supplies the digital sound signals to the signal processor 21. The signal processor 21 subjects the respective digital sound signals to crossover processing, delay processing, equalizer processing, limiter processing, dynamics processing, or other such signal processing, and outputs the processed sound signals to the D/A and A/D converter 22. The D/A and A/D converter 22 converts the respective digital sound signals into analog sound signals, and supplies the analog sound signals to the power amplification device 23. The power amplification device 23 subjects the respective analog sound signals to power amplification, and outputs the respective sound signals for the A-channel and the B-channel, which have been subjected to the power amplification, from terminals of loudspeakers to two external loudspeakers 3. The input device 20, the signal processor 21, and the power amplification device 23 include level controllers 20a, 21a, and 23a, respectively, each of which is configured to control the level of a sound signal based on a designated gain. The above-mentioned processing to be performed by the signal processor 21 and the gains of the level controllers 20a, 21a, and 23a are controlled by the CPU 10.

When a user inserts a plug 4 into an outlet to turn on the power switch 24, a current flows through the delay relay 25, and commercial power (AC 100 V) is supplied to the power supply 26 via the delay relay 25. Through the operation, the respective components of the amplifier 1 are supplied with DC power from the power supply 26, and the amplifier 1 is thus brought to an operating state. When the user turns off the power switch 24 in order to stop the amplifier 1, the power supply 26 transmits, to the CPU 10, an interrupt signal meaning that the power switch 24 has been turned off. After the power switch 24 is turned off, the delay relay 25 continues to cause a current to flow for a predetermined time period, and then interrupts the supply of power. Through this control, the power continues to be supplied from the power supply 26 to the respective components for the predetermined time period. The CPU 10 activates a second routine based on the received interrupt signal within the predetermined time period, controls the gain of at least any one of the level controller 20a of the input device 20, the level controller 21a of the signal processor 21, or the level controller 23a of the power amplification device 23, respectively, to mute the sound signal being output from the amplifier 1. When the predetermined time period has elapsed, the power supply from the delay relay 25 is interrupted to stop the power supply to the power supply 26 and also stop power supply to the respective components. By thus controlling the power supply to be stopped after the CPU 10 mutes the output of the sound signal from the amplifier 1, it is possible to inhibit an excessive noise waveform from being applied to the loudspeaker 3 when the power supply is stopped, to thereby be able to inhibit noise emitted from the loudspeaker 3 and inhibit a failure from being caused in the loudspeaker 3. The predetermined time period is set to, for example, several tens of milliseconds or several hundreds of milliseconds, and may be any time period that is sufficient to complete the muting performed under the control of the CPU 10 that has received the interrupt signal.

Figure 2:
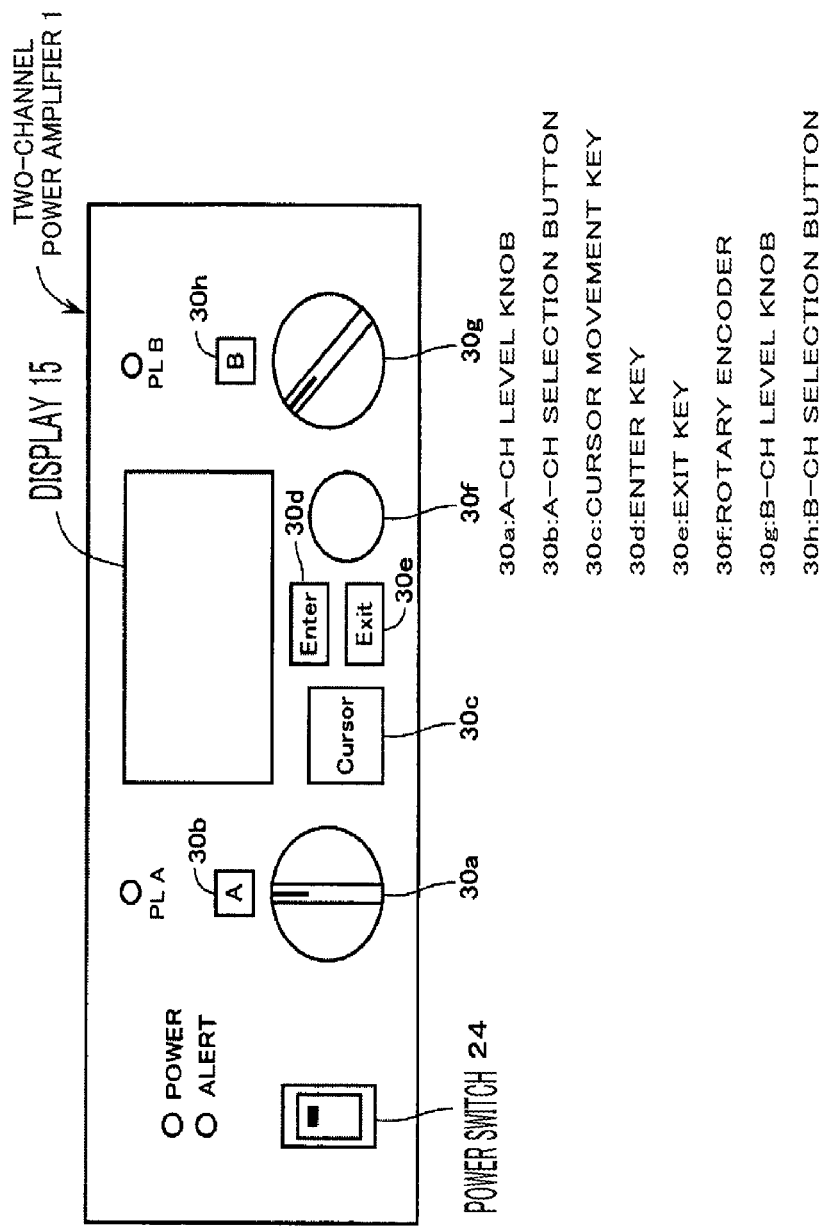
FIG. 2 is a diagram for illustrating a configuration of an operation panel of the two-channel power amplifier in the embodiment of this disclosure.

FIG. 2 is a diagram for illustrating a configuration of an operation panel of the amplifier 1. As illustrated in FIG. 2, the operation panel is provided with the display 15 having a rectangular shape in a substantially center part on the upper side, and is provided with the power switch 24 in a lower part on the left side. On the right side of the power switch 24, a knob 30a for adjusting a level for the A-channel and a button 30b for selecting the A-channel, which is labeled "A", are vertically arranged. A cursor movement key 30c is arranged further on the right side, and still further on the right side, an enter key 30d and an exit key 30e are vertically arranged. In addition, a rotary encoder (hereinafter referred to as "encoder") 30f is arranged further on the right side, and a knob 30g for adjusting a level for the B-channel and a button 30h for selecting the B-channel, which is labeled "B", are vertically arranged further on the right side. Further, a "POWER" lamp and an "ALERT" lamp are arranged above the power switch 24, a protector lamp PL A for the A-channel is arranged above the button 30b for selecting the A-channel, and a protector lamp PL B for the B-channel is arranged above the button 30h for selecting the B-channel.

Figure 3:
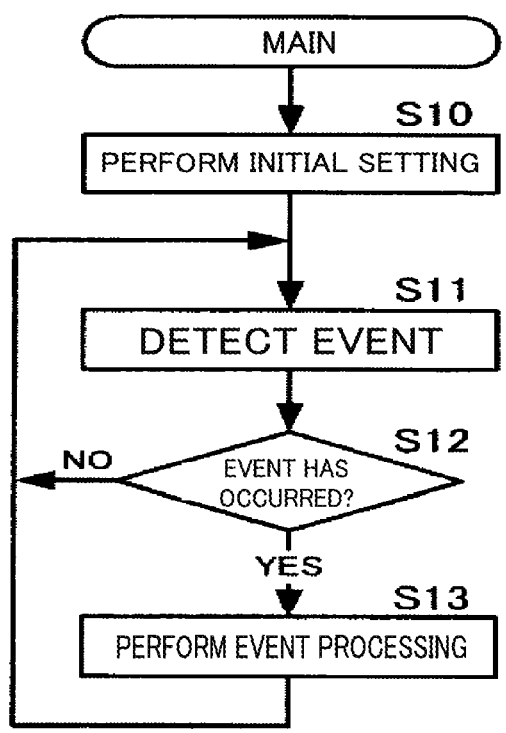
FIG. 3 is a flow chart of main processing to be executed by a CPU included in the two-channel power amplifier in the embodiment of this disclosure.

In the amplifier 1, when the power switch 24 is turned on to supply commercial power to the power supply 26, the CPU 10 executes main processing illustrated in FIG. 3.

When the main processing is started, in Step S10, the CPU 10 initializes the amplifier 1. As an example of the initialization of the amplifier 1, an initial value is set by clearing a register or a current memory area of the RAM 12 for storing the current data on the amplifier 1. In regard to the current data, a setting value effective at the previous time of turning off is set as the initial value, and hence an operation performed at the previous time of turning off is reproduced in the amplifier 1. Subsequently, in Step S11, the CPU 10 performs event detection processing. In the event detection processing, the CPU 10 detects an event that "an operating element is operated" for each of the operating elements including the knobs and the buttons that are arranged on the operation panel of the amplifier 1, an event that "a predetermined time period elapses", an event that "an interrupt signal is received" when the power switch 24 is turned off, and other such event. When the CPU 10 detects an event, "YES" is determined in Step S12, and the flow advances to Step S13, in which the CPU 10 performs event processing based on the kind of the event. Meanwhile, when the CPU 10 fails to detect an event, "NO" is determined in Step S12, and the flow returns to Step S11, in which the CPU 10 stands by for the detection of an event.

When the event that "an operating element is operated" is detected in Step S11, as the "event processing" in Step S13, the CPU 10 selects a desired parameter from among a plurality of parameters, changes a parameter value of the selected parameter on the current memory, or performs other such processing based on the kind of the operation performed through the operating element. When the parameter value on the current memory is changed, the CPU 10 further controls, for example, the operation of the input device 20, the signal processing to be performed on the sound signal by the signal processor 21, or the operation of the power amplification device 23 based on the changed parameter value. After the parameter value on the current memory of the RAM 12 is stored (backed up) in the flash memory 11, for example, at the time of its change, the CPU 10 reads the stored parameter value and sets the parameter value in the current memory, when the amplifier 1 is activated, to thereby be able to reproduce the setting.

For example, when the user operates the button 30b for selecting the A-channel, operation event processing corresponding thereto is performed to bring the A-channel to a selected state, and to display an edit screen for the A-channel on the display 15. When the user operates the cursor movement key 30c to put a cursor over an item to be edited on the edit screen and then presses the enter key 30d, operation event processing corresponding thereto is performed to display, on the display 15, a detail screen for displaying individual parameters of the item to be edited. When the user further operates the cursor movement key 30c to put the cursor over the parameter to be edited, rotates the encoder 30f, and presses the enter key 30d, operation event processing corresponding thereto is performed to cause the CPU 10 to change the value of the selected parameter. Meanwhile, when the user operates the exit key 30e, operation event processing corresponding thereto is performed to return to an upper tier. In this manner, the CPU 10 executes processing based on the operation event of each operating element.

Figure 4:
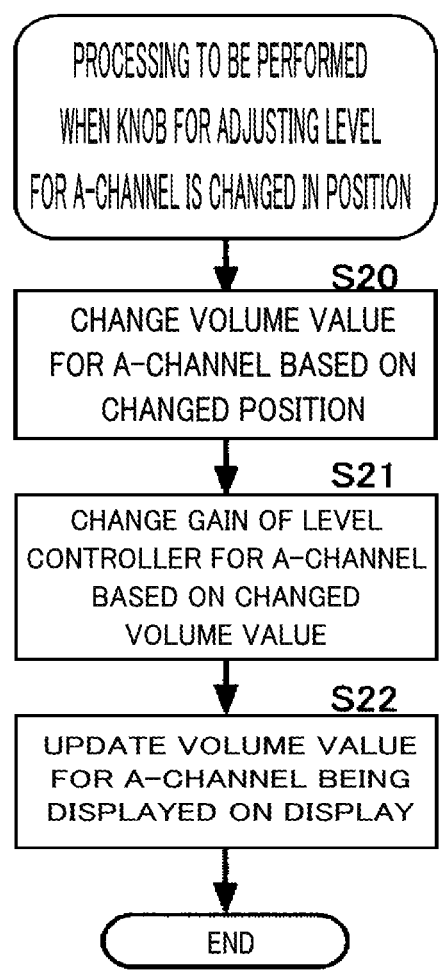
FIG. 4 is a flow chart of processing to be performed when a knob for adjusting a level for an A-channel is changed in position, which is to be executed by the CPU included in the two-channel power amplifier in the embodiment of this disclosure.

As a further detailed example, when the user rotates the knob 30a for adjusting the level for the A-channel, in Step S13, the CPU 10 starts processing to be performed when a knob for adjusting the level for the A-channel is changed in position, which is illustrated in FIG. 4. When this processing is started, in Step S20, the CPU 10 changes a volume value for the A-channel stored in the current memory based on the position or rotation amount of the knob 30a for adjusting the level for the A-channel. Subsequently, in Step S21, the CPU 10 changes the gain of at least one of the level controller 20a, 21a, or 23a for the A-channel based on the changed volume value. Subsequently, in Step S22, the CPU 10 updates the volume value for the A-channel being displayed on the display 15 in units of dB, and the processing to be performed when the knob for adjusting the level for the A-channel is changed in position is brought to an end. In addition, when the user rotates the knob 30g for adjusting the level of the B-channel, the CPU 10 performs the above-mentioned processing in a similar manner to change the gain of at least one of the level controller 20a, 21a, or 23a for the B-channel based on the position or rotation amount of the rotated knob 30g for adjusting the level of the B-channel, and to update a volume value for the B-channel being displayed.

Referring back to the main processing, when the event that "a predetermined time period elapses" is detected in Step S11, as the "event processing" in Step S13, the CPU 10 detects the state quantities of the respective components of the amplifier 1, and controls the display performed on the display 15 based on the detected state quantities. For example, the CPU 10 detects the temperature, voltage, electric current, and the like in an output stage of the power amplification device 23 to display the detected information on the display 15, and detects the state of a protection circuit to turn on or off the protector lamps PL A and PL B. The protection circuit detects an overcurrent in the output stage, overheating in the output stage, an excessively low load impedance, and other such malfunction relating to the output stage for each channel in the amplifier 1, and reduces the gain of the corresponding level controllers 20a, 21a, and 23a, to thereby protect the output stage of the amplifier 1 and the loudspeaker. When a malfunction in the output stage for each channel is detected by the protection circuit, the CPU 10 turns on the corresponding protector lamp PL A or PL B, and when a malfunction is not detected, turns off the corresponding protector lamps PL A and PL B.

When the event that "an interrupt signal is received" occurs, the CPU 10 interrupts the main processing to execute processing corresponding to the reception of the interrupt signal. Specifically, the CPU 10 gradually reduces the gain of at least one of the level controller 20a of the input device 20, the level controller 21a of the signal processor 21, or the level controller 23a of the power amplification device 23, respectively, to zero (−∞dB) to mute the sound signal being output from the power amplification device 23. After that, due to the action of the delay relay 25, the supply of power to each of the components is interrupted as described above. In processing corresponding to the reception of this interrupt signal, the CPU 10 writes, to the flash memory 11, the parameter value stored on the current memory of the RAM 12 before the muting.

Figure 5:
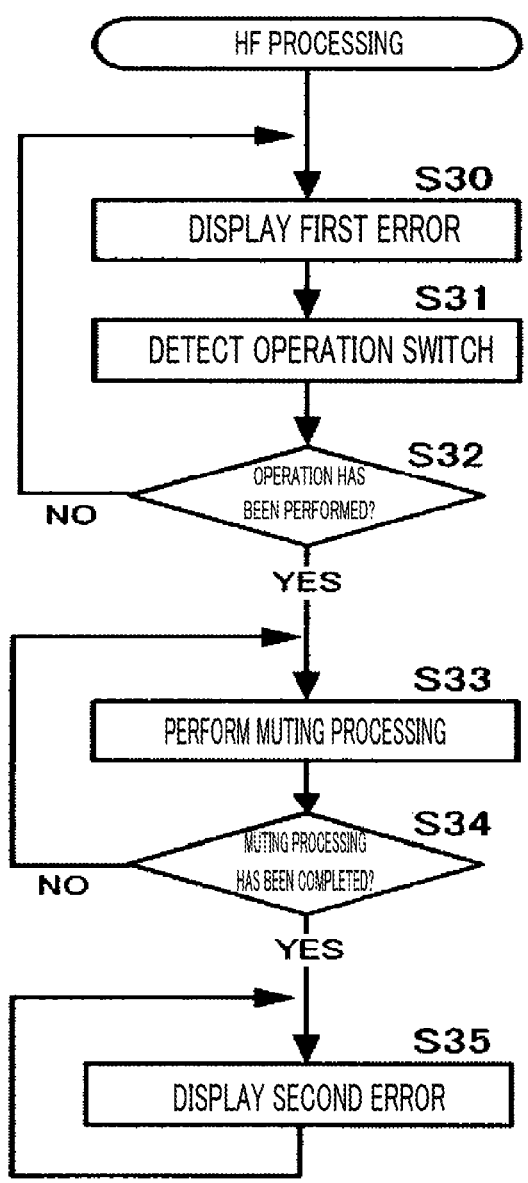
FIG. 5 is a flow chart of hard fault (HF) processing to be executed by the CPU included in the two-channel power amplifier in the embodiment of this disclosure.

When some malfunction occurs in the CPU 10, the CPU 10 starts hard fault processing (HF processing) illustrated in FIG. 5. In this case, examples of the malfunction in the CPU 10 that causes an interrupt include reading of an invalid command by the CPU 10, access to an invalid address, an error caused by a stack, and division by zero. The HF processing is interrupt processing having a high priority, and does not receive an interrupt issued in a normal operation of the amplifier 1.

After starting the HF processing, in Step S30, the CPU 10 causes the display 15 to display a first message that reads "The fatal error occurred! Please press any button to mute sounds." and causes the "ALERT" lamp to blink fast at an interval of less than one second. This fast blinking indicates that a serious error has occurred and that the sound signal is to be muted through pressing of any one of the buttons. Subsequently, in Step S31, the CPU 10 retrieves the on/off state of each operation switch provided to the operation panel to detect whether or not the each operation switch has been operated. Any one of the buttons including the button 30b for selecting the A-channel, the cursor movement key 30c, the enter key 30d, the exit key 30e, and the button 30h for selecting the B-channel is set as the operation switch. When the CPU 10 determines in Step S32 that the operation switch has been operated ("YES" is selected in Step S32 illustrated in FIG. 5), the flow advances to Step S33, in which the CPU 10 performs muting processing. In short, the gain of at least one of the level controller 20*a*, 21*a*, or 23*a* is gradually reduced to zero (−∞dB) to mute the sound signal being output from the power amplification device 23. Meanwhile, when the CPU 10 determines in Step S32 that the operation switch has not been operated ("NO" is selected in Step 32 illustrated in FIG. 5), the flow returns to Step S30, and the processing of Step S30 and Step S31 is repeatedly performed until the operation of the operation switch is detected.

The CPU 10 determines "NO" in Step S34 until the muting of the sound signal is completed, and the muting processing of Step S33 is repeatedly executed. When the CPU 10 determines that the muting has been completed (selects "YES" in Step S34 illustrated in FIG. 5), the flow advances to Step S35, in which the CPU 10 causes the display 15 to display a second message that reads "Sounds were muted. Now, you can turn off the power switch safely." The CPU 10 also causes the "ALERT" lamp to blink slowly at an interval of at least one second, for example, several seconds. This slow blinking indicates that the sound signal has been muted and the power can be turned off safely, and continued until the power switch 24 is turned off. The display of this second message allows the user to know that the power switch 24 can be turned off safely. In a case where a malfunction occurs in the CPU 10, there is no guarantee that the CPU 10 can activate power-off interrupt processing when the power switch 24 is turned off, and hence the sound signal is muted in the HF processing to allow the user to turn off the power safely.

In the above-mentioned HF processing, when the first message is displayed in response to the malfunction in the CPU 10, the user determines the state of the sound signal being output by the amplifier 1 based on the sound from the loudspeaker 3 or the like connected to the amplifier 1. When determining that there is no need to mute the sound signal, the user can continue to cause the sound to be output from the amplifier 1 as it is by avoiding performing any operation. After that, when the use of the amplifier 1 is finished, the user operates any one of the operation switches to mute the sound signal, then confirms the second message, and turns off the power switch 24 safely.

Meanwhile, when the first message is displayed and the user determines that the sound being emitted is unexpected sound, the user can mute the sound signal in the amplifier 1 by operating any one of the operation switches. In this case, the sound signal can be muted through the operation of any operation switch, and hence even when the user is confused, the user can mute the sound signal without an operation error. After that, the user can turn off the power switch 24 safely by confirming the second message. The HF processing is set as a first routine having a high priority, which does not receive an interrupt from another routine, and hence a routine in a processing block on a path through which the sound signal passes is not executed while the HF processing is being performed. That is, none of the routines for controlling the input device 20, the signal processor 21, the D/A and A/D converter 22, and the power amplification device 23 is executed. Therefore, the sound signal being output from the amplifier 1 continues to have a state exhibited at the time of the detection of the malfunction in the CPU 10.

That is, according to the audio device described above, when a malfunction is detected in the controller, the controller notifies the user that the malfunction has occurred, but muting is not performed at this time point, and hence the sound signal from the audio device continues to be output. Therefore, the user determines the state of the sound signal based on the sound being emitted from the loudspeaker or the like, and when determining that there is no need to mute the sound signal, the user can continue to cause the sound to be output from the audio device by avoiding performing any operation. Meanwhile, when the user determines that the sound being emitted is unexpected sound, the user can mute the sound signal in the audio device by operating the operating element. With this configuration, the user can turn off the power of the audio device safely without damaging the loudspeaker or the like.

In the audio device according to the embodiment of this disclosure described above, a method of using a watchdog timer or other such method may be employed to detect a malfunction in the controller (CPU) and activate the first routine. Depending on the detection method, an interrupt to the first routine to be activated is not automatically inhibited, and hence it is required to explicitly inhibit the interrupt in such a case.

Further, the audio device according to the embodiment of this disclosure is not limited to a power amplifier or other such amplifier, and can be applied to an audio device including a controller formed of a CPU. When the first message is displayed, the user may examine the sound by sound from headphones instead of the sound from the loudspeakers.

Further, a message to be displayed as the first message in the audio device according to the embodiment of this disclosure is not limited to the above-mentioned example message to be displayed as long as the message indicates that a serious error has occurred and that the sound signal is to be muted through pressing of any one of the buttons. In addition, a message to be displayed as the second message is not limited to the above-mentioned example message to be displayed as long as the message indicates that the sound signal has been muted and the power switch can be turned off safely. The display 15 may be configured to indicate that the sound signal is being muted while the muting processing of Step S33 is repeatedly performed.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An audio device comprising:
   a processor configured to receive a sound signal, perform signal processing on the sound signal, and output a processed signal;
   a display device;
   a plurality of operating elements;
   a controller configured to:
      change a value of a parameter in accordance with an operation performed through any one of the plurality of operating elements by a user;
      cause the display device to display the value of the parameter; and
      write the value of the parameter in a current memory; and
   a detector configured to detect that a malfunction has occurred in an operation of the controller,
   wherein the processor is configured to perform the signal processing according to the value of the parameter stored in the current memory,
   wherein the controller is configured to:
      execute a first routine, which is uninterruptable by another routine, when the detector detects the malfunction; and cause, in the first routine, the display device to display a first message without newly storing the value of the parameter in the current memory; and mute, in the first routine, the processed signal in accordance with an operation performed through any one of the plurality of operating elements.

2. The audio device according to claim 1, wherein the first message is displayed to notify the user that an error has occurred.

3. The audio device according to claim 1, wherein the first message is displayed to notify the user that the processed signal is to be muted when the operating element is operated.

4. The audio device according to claim 1, wherein the controller is configured to cause, after the muting of the processed signal output from the processor is completed, the display device to display a second message, and to inform, through the displaying of the second message, the user that the user may turn off a power switch.

5. The audio device according to claim 1, wherein the first routine includes a routine of hard fault processing.

6. A control method for an audio device comprising:
a processor configured to receive a sound signal, perform signal processing on the sound signal according to a value of a parameter stored in a current memory, and output a processed signal;
a display device;
a plurality of operating elements; and
a detector,
the control method comprising:
changing the value of the parameter in accordance with an operation performed through any one of the plurality of operating elements by a user;
causing the display device to display the value of the parameter;
writing the value of the parameter in the current memory;
executing a first routine, which is uninterruptable by another routine, when the detector detects a malfunction;
causing, in the first routine, the display device to display a first message without newly storing the value of the parameter in the current memory; and
muting, in the first routine, the processed signal in accordance with an operation performed through any one of the plurality of operating elements.

7. The control method for an audio device according to claim 6, wherein the first message is displayed to notify the user that an error has occurred.

8. The control method for an audio device according to claim 6, wherein the first message is displayed to notify the user that the processed signal is to be muted when the operating element is operated.

9. The control method for an audio device according to claim 6, further comprising causing, after the muting of the processed signal output from the processor is completed, the display device to display a second message, and informing, through the displaying of the second message, the user that the user may turn off a power switch.

10. The control method for an audio device according to claim 6, wherein the first routine includes a routine of hard fault processing.

* * * * *